United States Patent [19]

Fukuzawa et al.

[11] Patent Number: 4,720,836
[45] Date of Patent: Jan. 19, 1988

[54] DISTRIBUTED FEEDBACK SEMICONDUCTOR LASER

[75] Inventors: Tadashi Fukuzawa, Setagaya; Hiroyoshi Matsumura, Iruma; Shinji Tsuji; Hitoshi Nakamura, both of Hachioji; Kenji Hiruma, Koganei, all of Japan

[73] Assignee: Hitachi, Ltd., Tokyo, Japan

[21] Appl. No.: 767,631

[22] Filed: Aug. 20, 1985

[30] Foreign Application Priority Data

Sep. 28, 1984 [JP] Japan .................. 59-201657

[51] Int. Cl.⁴ .................... H01S 3/08; H01S 3/19
[52] U.S. Cl. ................................. 372/96; 372/46
[58] Field of Search ......................... 372/96, 46

[56] References Cited

U.S. PATENT DOCUMENTS 4,400,813 8/1983 Kaminow ........................... 372/46
4,594,603 6/1986 Holonyak, Jr. ................... 372/46

OTHER PUBLICATIONS

Harris et al., "Distributed Feedback Semiconductor Injection Laser", IBM Technical Disclosure Bulletin, vol. 16, No. 1, Jun. 1973, pp. 171-172.

Primary Examiner—James W. Davie
Attorney, Agent, or Firm—Antonelli, Terry & Wands

[57] ABSTRACT

The present invention relates to a semiconductor laser which oscillates in a single longitudinal mode and with a low threshold current and which exhibits a good mode stability against reflected light, and provides a structure of a distributed feedback semiconductor laser with modulation for a gain. The structure is such that gain producing regions are periodically arranged and that a substance transparent to laser radiation is buried between the regions. A layer including the gain regions is formed of a superlattice layer, and an impurity is diffused or implanted into periodic positions of the layer, whereby the transparent regions and the gain regions with little lattice damages can be readily formed.

6 Claims, 3 Drawing Figures

DISTRIBUTED FEEDBACK SEMICONDUCTOR LASER

BACKGROUND OF THE INVENTION

The present invention relates to a wavelength stabilized semiconductor laser.

The stabilization of a wavelength in a semiconductor laser is permitted by endowing laser radiation with distributed feedback based on a refractive index change or/and distributed feedback based on a gain change. At the very stage at which a distributed feedback (abbreviated to 'DFB') laserd was realized, a double heterostructure was fabricated in such a way that a GaAs layer, being a laser active layer, was directly provided with a grating structure and was sandwiched between two semiconductor layers (p-type GaAlAs and n-type GaAlAs) having wider band gaps and having conductivity types opposite to each aother. With a laser of this type, since refractive index of GaAs is higher than that of GaAlAs, coupling based on the index change arises. Further, since the laser active layer itself changes in thickness periodically in the propagation direction of the laser radiation, coupling based on the gain change arises. In this system, the active layer having a high density of carriers is directly corrugated, and the nonradiative recombination of the carriers occurs due to lattice damages at the corrugated heterointerface. For this reason, lasing took place only at low temperatures of 80°–150° K. (Nakamura et al., IEEE J. of Quantum Electronics, Vol. QE-11, No. 7, 436 (1975)). In order to solve this problem, a method in which a corrugated part and a laser active layer were separated (separate-confinement heterostructure: SCH) was adopted (H. C. Casey et al., Appl. Phys. Lett. 27, 142 (1975) and K. Aiki et al., Appl. Phys. Lett. 27, 145 (1975)). Thus, the injected carriers were prevented from causing the nonradiative recombination ascribable to the damages near the corrugation, and the lasing became possible at room temperatures. With this laser, the gain is uniform in the propagation direction of laser radiation, so the coupling based on the gain does not arise, and only the coupling based on the modulation of the refractive index arises. In this case, as regards the longitudinal mode of the laser, two modes near the Bragg frequency have equal gains, so that when reflected light has entered the laser, the longitudinal mode changes to cause noise. In order to prevent such influence of the reflected light upon the stability of the lasing, the method of the distributed feedback may be done by gain coupling, and the longitudinal mode of the laser may be brought into agreement with the Bragg frequency itself (H. Kogelnik, J. of Appl. Phys. 43, 2327 (1972)).

To sum up, in order to obtain a frequency-stabilized laser which involves little noise attributed to reflected feedback light from surroundings such as an optical fiber and which operates stably at the toom temperature, it is required that the distributed feedback of the gain be given to the laser active region itself and that a method and a structure for preventing the occurrence of the lattice damages be developed.

Such a structure is described in Japanese Patent Application Laid-open No. 50-114186. In order to obtain the distributed feedback of the gain, a double hetero-region including a laser active layer is removed by ion milling or chemical etching, whereupon GaAlAs is buried by liquid phase epitaxy (LPE). It is known, however, that the etching by the ion milling causes a large number of damages. With the chemical etching, slits more than 1 μm deep cannot be formed at pitches of several thousand Å, and the desired results discussed above can not be achieved.

Japanese Patent Appliction Laid-open No. 51-71684 teaches a distributed feedback laser wherein GaAs doped with Cr is periodically disposed between the p-side electrode and p-type GaAlAs cladding layer of the laser, to endow the injection current density in the propagation direction of laser radiation with a periodicity. However, a cladding layer 1-1.5 μm thick is required for confining the laser radition in the thickness direction of a crystal with low loss, and the current density endowed with the distributed feedback becomes uniform in the active layer due to the spread of current.

There has been reported in Japanese Patent Application Laid-open No. 52-45888, a method wherein, in order to prevent this effect, protons etc. are periodically implanted directly in an active layer so as to establish a distributed current density. However, a laser with the protons implanted in the active layer large number of damages and has not been put into practical use even for controlling the transverse mod of the laser.

SUMMARY OF THE INVENTION

An object of this invention is to provide a long-lived single longitudinal mode laser which has a low threshold current and is stable against mode hopping.

The essence of the present invention is as follows.

A DFB semiconductor laser with modulation for a gain according to the present invention has a structure in which, in order to attain the distributed gain necessary for the modulation of the gain, superlattice regions formed of a semiconductor layer are periodically arranged as regions for producing the gain, and a substance transparent to the radiation of the laser is buried between the regions.

As a form useful for applying this structure, means to establish distributed feedback is constructed of a periodic structure which consists of superlattice regions formed of a semiconductor layer and disordered regions formed by the interdiffusion of the superlattice.

The period ($\Lambda$) of the structure may be determined in accordance with the following general formula:

$$\Lambda = \lambda l / 2 n_g \tag{1}$$

where $\lambda$ denotes the lasing wavelength of the laser, l denotes the order of the periodic structure (corresponding to a diffraction grating), and $n_g$ denotes the effective index of a waveguide for mode.

The thickness of active regions made of teh superlattice regions is usually approximately 0.1 μm–1.0 μm. Accordingly, the thickness of the disordered regions conforms thereto.

The interdiffusion of the superlattice is realized in such a way that an impurity is introduced into the predetermined regions by the process of diffusion, ion implantation or the like, whereupon annealing is carried out. When the lateral diffusion of the impurity is considered, the thickness of the disordered regions should preferably be, at most, nearly equal to the period. The interdiffusion of the superlattice is, per se, taught in the following papers:

(1) W. D. Laidig et al.: Appl. Phys. Lett. 38, 776 (1981) "Disorder of an AlAs-GaAs superlattice by impurity diffusion".

(2) J. J. Coleman et al.: Appl. Phys. Lett. 40, 904 (1982) "Disorder of an AlAs-GaAs superlattice by silicon implantation".

Regarding a GaAs/GaAlAs system, this technique is a phenomenon in which a superlattice of GaAs/GaAlAs or the like is doped with an impurity such as, for example, Zn or Si to approximately $1 \times 10^{19}$ atoms/cm$^3$ by diffusion or ion implantation and is subjected to annealing, whereby Ga and Al in the superlattice interdiffuse until the superlattice becomes a homogeneous alloy of GaAlAs.

By applying this phenomenon to a GaAs/GaAlAs multi-quantum well (MQW) type laser active layer, the interdiffusion is induced periodically in the traveling direction of laser radiation, and non-gaining regions transparent to the laser radiation are formed. In general, when the superlattice structure is disordered, the regions have a band gap which is effectively greater than that of the multi-quantum regions, so currents flow through the regions other than the interdiffused regions. Thus, the periodic distribution of the gain regions intended first is attained.

It has been confirmed by observation with a transmission electron microscope that no lattice mismatch is involved in the boundary between the superlattice and each region where the superlattice has been nullified by the interdiffusion, and the distributed feedback of the gain has been realized without causing point defects or edge dislocations.

DETAILED DESCRIPTION OF THE PRESENTLY PREFERRED EMBODIMENTS

Embodiment 1

Figure 1:
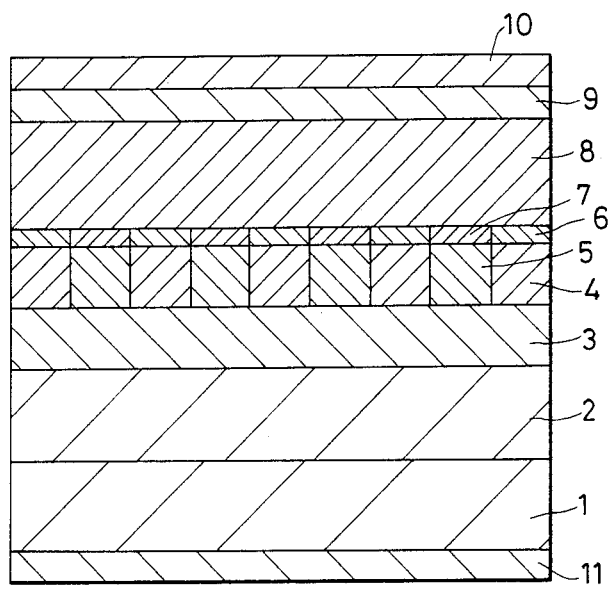
FIG. 1 is a sectional view of a distributed feedback semiconductor laser fabricated by the use of the method of the present invention, taken along a plane containing a resonator.

An embodiment will be described with reference to FIG. 1. This figure is a sectional view taken along a plane parallel to the traveling direction of laser radiation, and enlarges part of a periodic structure.

On a p-type GaAs substrate (1), there were successively grown by well-known molecular beam epitaxy (MBE) a p-type Ga$_{0.65}$Al$_{0.35}$As cladding layer (2) (3 $\mu$m thick), a p-type Ga$_{0.7}$Al$_{0.3}$As optical guide layer (3) (0.7 $\mu$m thick), an MQW laser active layer (5) (five GaAs layers each being 80 Å thick and five Ga$_{0.7}$Al$_{0.3}$As layers each being 60 Å thick were stacked alternately), and an n-type Ga$_{0.7}$Al$_{0.3}$As optical guide layer (7) (500 Å thick). A layer 6 is a protector for the MQW active layer, and may satisfactorily be made of a Ga$_{1-x}$Al$_x$As layer which has a value of x similar to that of the optical guide layer. On the laminated structure thus prepared, Mo was evaporated to 1000 Å as a mask for ion implantation. A grating of photoresist having a period of 2580 Å was made on the Mo film by a holographic photoresist exposure method, and a grating pattern was etched in the Mo by well-known dry etching which employed CCl$_2$F$_2$ gas. Si ions were implanted at a dose of $10^{14}$/cm$^2$ by 200 keV. After the Mo mask was removed, the surface of the wafer was etched slightly. Thereafter, an n-type Ga$_{0.65}$Al$_{0.35}$As cladding layer (8) (1.5 $\mu$m thick) and an n-type GaAs cap layer (9) were grown by rhe molecular beam epitaxy. Subsequently, the resultant structure was annealed at 800° C. under an arsenic overpressure for 1 hour. In FIG. 1, numeral 5 designated GaAs/GaAlAs superlattice regions which are regions producing a laser gain, and numeral 4 regions in which the superlattice has been interdiffused by the Si ions and which are nongaining regions transparent to the laser radiation. The laser had a total length of 500 $\mu$m, and regions at both the ends of the laser each being 50 $\mu$m long were entirely doped with the Si nullify the superlattice, in order to suppress the occurrence of the Fabry-Perot mode. The annealed wafer was subjected to a process similar to that of an ordinary buried heterostructure semiconductor laser (buried heterostructure semiconductor laser have been reported by N. Chinone et al. in Appl. Phys. Lett. 35, 523, 1979, and so forth), to render the stripe width of the active layer 1 $\mu$m and to provide buried regions of GaAlAs 16. More specifically, a mesa region of predetermined width was formed in the traveling direction of the laser, whereupon semiconductor layers were grown on both the side surfaces thereof in order to confine the radiation in the mesa region (buried regions).

Next, an insulator film (9) of an SiO$_2$ film or the like was formed except a current injection region which cooresponded to the top of the mesa, and an electrode 10 was formed thereon. In addition, an electrode 11 was formed on the rear surface of the semiconductor substrate.

Figure 2:
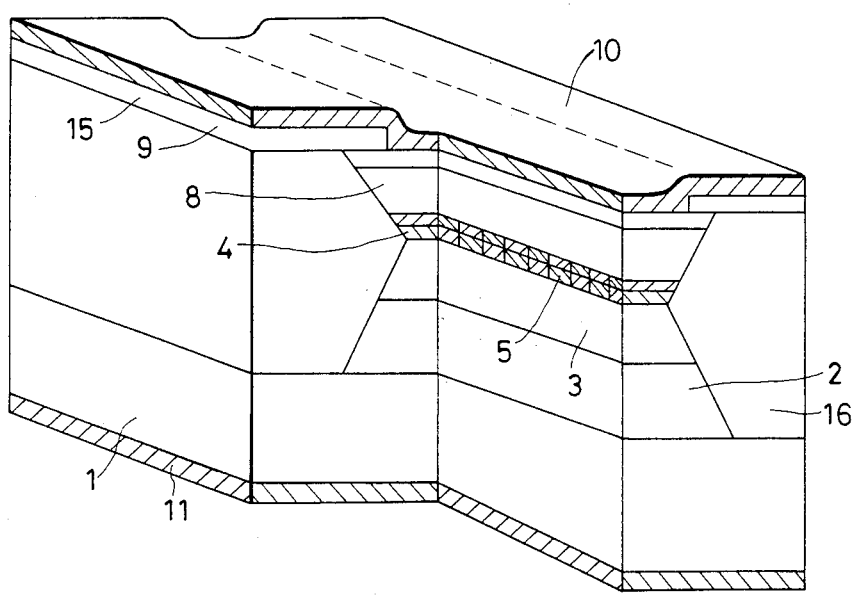
FIG. 2 is a perspective view showing an example of a distributed feedback semiconductor laser employing a buried structure.

FIG. 2 is a perspective view of the present example, in which the interior of the crystal is clearly shown by cutting parts of the example. Symbols denote the same portions as in FIG. 1.

The threshold value of lasing was 25 mA, and the lasing wavelength was 838 nm. The occurence of noise was examined by reflecting part of the laser radiation with a mirror so as to return it into the laser resonator. As a result, the laser operated stably up to a reflected light intensity which was double that of a conventional DFB laser having a diffraction grating.

From the viewpoint of the stabilization of the single longitudinal mode which forms the first object of the present invention, the buried heterostructure is not always necessary, but the typical buried hetrostructure for stabilizing the transverse mode was used in the present embodiment.

Naturally, the existing means for stabilizing the transverse mode can be freely used conjointly with the present invention.

Embodiment 2

While Embodiment 1 was an example employing a p-type substrate, the present invention can of course be performed quite similarly even with a n-type substrate.

On an n-type GaAs (plane orientation: 100) substrate, there were gorwn by molecular beam epitaxy an n-Ga$_{0.65}$Al$_{0.35}$As cladding layer 3 $\mu$m thick, an n-type Ga$_{0.7}$Al$_{0.3}$As optical guide layer 0.7 $\mu$m thick, and undoped multi-quantum well laser active layer (five GaAs layers each being 80 Å thick and five Ga$_{0.7}$Al$_{0.3}$As layers each being 35 Å thick were stacked alternately) and a p-type Ga$_{0.7}$Al$_{0.3}$As buffer layer (500 Å thick). Subsequently, Si ions were implanted as in Embodiment 1 by ordinary ion implantation, and the resultant structure was annealed, thereby to obtain a structure having a period of 2600 Å in which superlattice regions and disordered regions were alternately arrayed in the laser active layer. Thenceforth, the same method as in Embodiment 1 was used to fabricate a distributed feedback semiconductor laser.

As a dummy wafer, a wafer having quite the same structure as a laser was subject to steps similar to those of the foregoing with Si ions and regions not implanted and was then annealed. When the refractive indices of both the wafers were measured at the lasing wavelength of the laser, no difference was observed within the range of measurement accuracy. This indicates that, in the wafer of this embodiment, the distributed feedback of the refractive index is not involved, but rather only the distributed feedback of a gain occurs.

The threshold value of the lasing of the foregoing semiconductor laser was 30 mA, and the stability of the laser against reflected light was improved to seven times that of a prior-art DFB laser.

Embodiment 3

While the examples mentioned above employed the semiconductor material GaAs-GaAlAs, the present invention can be performed with other materials.

A similar distributed feedback semiconductor laser can be realized even when the essential portions of the semiconductor laser are formed by growing on a p-type GaAs substrate a p-type GaAs cladding layer (3 μm thick), an $In_{0.18}Ga_{0.82}As$/GaAs-system multi-quantum well layer (five well layers each being 70 Å thick and five barrier layers each being 40 Å thick were stacked alternately) and an n-type GaAs cap layer 300 Å thick. The respective layers mentioned above may be formed using Mo-CVD (Metal-organic (Chemical Vapor Deposition). Likewise to the previous embodiments, Si ions are implanted through a grating-like mask, an n-type GaAs cladding layer was further grown, and the resultant structure is thereafter annealed at 800° C. for 1.5 hours. Thus, the object of the present invention can be achieved.

The same object can be accomplished even when an InP substrate is used. For example, an n-InP cladding layer, an undoped InGaAs/InGaAlAs multi-quantum well laser active layer and a p-InP layer 200 Å thick were grown on an n-type InP substrate by the MOCVD process, whereupon Si ions were implanted by the same method as in the above example. After p-InP was grown by the MOCVD process, annealing was carried out. A single longitudinal mode was oscilalted by coupling based on a first-order gain grating.

Embodiment 4

Figure 3:
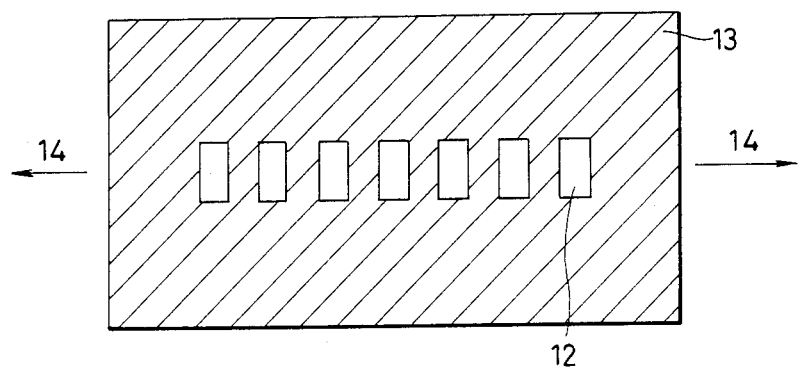
FIG. 3 is a plan view showing a mask pattern for ion implantation.

The mask pattern used at the step of implanting the Si ions in Embodiment 1 was replaced with one shown in FIG. 3 so as to dope a portion 13 with Si. Int he figure, numeral 12 indicates the position of an active layer. This active layer is a quantum well laser active layer which is not implanted with Si, and which has a periodic structure so as to become a second-order diffraction grating in the direction 14 of a laser cavity. When a laser is fabricated by this method, the laser active layer is buried in GaAlAs of wider band gap and lower refractive index, so that the confinement of the transverse mode of the laser becomes possible. More specifically, the control of the longitudinal mode as well as the transverse mode of the laser and the confinement of carriers can be done by one process, and the burying growth based on liquid phase epitaxy as indicated in the previous embodiments is not required. The threshold value of lasing was 38 mA.

As described above in conjunction with the embodiments, the present invention could establish the distributed feedback of a refractive index and the distributed feedback of a gain without forming a corrugated grating in a semiconductor laser and with a completely flat crystal growth plane left intaCt. It has been revealed by observation with a transmission electron microscope (TEM) that a crystal grown on a grating fabricated by this method has much fewer numbers of dislocations and defects of the crystal when compared with a crystal grown on the corrugated grating. This gives a favorable result to the extension of the lifetime of the laser.

Another advantage of this invention is that pure gain coupling or both gain coupling and index coupling can be freely chosen by changing the thickness of a barrier in a multi-quantum well. Thus, the longitudinal mode of the laser can be selected, and a laser having almost no noise attributed to reflected light is provided.

The above advantages are improvements in characteristics in the functional aspect of the laser. Also from the standpoint of process, a method of making a distributed feedback structure with ion implantation is richer in mass-producibility than a method of making a diffraction grating with chemical etching.

What is claimed is:

1. A distributed feed-back semiconductor laser comprising a substrate having a plurality of semiconductor layers including an active layer, said plurality of semiconductor layers having gain regions for radiation, said active layer comprising a superlattice structure of a semiconductor, means for providing current to said gain regions, and means for optical feed-back comprising superlattice regions and disordered semiconductor regions that have been alternately arrayed in the direction of a laser cavity, said disordered semiconductor regions having a band gap larger than that of said superlattice regions.

2. A semiconductor laser according to claim 1, wherein said disordered semiconductor regions are formed by disordering said superlattice structure.

3. A semiconductor laser according to claim 1, wherein said disordered semiconductor regions are formed throughout the depth of said superlattice structure, such that said active layer includes said disordered semiconductor regions alternating with said superlattice regions.

4. A semiconductor laser according to claim 2, wherien said disordered semiconductor regions are formed throughout the depth of said superlattice structure, such that said active layer includes said disordered semiconductor regions alternating with said superlattice regions.

5. A semiconductor laser according to claim 1, further comprising buried regions formed throughout the depth of said plurality of semiconductor layers.

6. A semiconductor laser according to claim 5, wherein said buried regions are mesa regions.

* * * * *